(12) United States Patent
Oshima et al.

(10) Patent No.: US 9,616,660 B2
(45) Date of Patent: Apr. 11, 2017

(54) LIQUID EJECTION DEVICE AND PRINTING DEVICE

(71) Applicant: SEIKO EPSON CORPORATION, Tokyo (JP)

(72) Inventors: Atsushi Oshima, Kanie-cho (JP); Noritaka Ide, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 176 days.

(21) Appl. No.: 14/223,051

(22) Filed: Mar. 24, 2014

(65) Prior Publication Data

US 2014/0285579 A1    Sep. 25, 2014

(30) Foreign Application Priority Data

Mar. 25, 2013   (JP) .................................. 2013-062926

(51) Int. Cl.
  *B41J 2/045*  (2006.01)
  *H05K 1/02*   (2006.01)

(52) U.S. Cl.
  CPC ....... *B41J 2/04581* (2013.01); *B41J 2/04541* (2013.01); *H05K 1/0231* (2013.01)

(58) Field of Classification Search
  CPC . H01L 2924/01079; H01L 2224/48247; H01L 2924/13091; H01L 2924/30107; H01L 2224/48137; H01L 23/50; H01L 23/5383; H01L 23/5384; H01L 23/642; H01L 25/16; H01L 27/0694; H01L 2924/00; H05K 1/0231; H01H 2033/66276; H01H 33/66207; H01H 33/66261

USPC ......................................... 361/760, 782, 783
See application file for complete search history.

(56) References Cited

U.S. PATENT DOCUMENTS

| | | | | |
|---|---|---|---|---|
| 7,428,155 B2 * | 9/2008 | Nakao | .................. | H05K 1/0225 361/792 |
| 7,984,956 B2 * | 7/2011 | Tabata | ................. | B41J 2/04541 347/10 |
| 8,618,632 B2 * | 12/2013 | Kawashima | ............ | H01L 23/50 257/532 |
| 9,515,027 B2 * | 12/2016 | Tamaki | ................ | H05K 1/0225 |
| 2002/0175661 A1 * | 11/2002 | Wheeler | ............... | H02M 1/088 323/282 |
| 2006/0137905 A1 * | 6/2006 | Kariya | .................. | H05K 1/162 174/255 |

FOREIGN PATENT DOCUMENTS

| | | |
|---|---|---|
| JP | 2006-247911 A | 9/2006 |
| JP | 2009-248501 A | 10/2009 |
| JP | 2011-187809 A | 9/2011 |

* cited by examiner

*Primary Examiner* — Nathan Milakovich
(74) *Attorney, Agent, or Firm* — Maschoff Brennan

(57) ABSTRACT

A liquid ejection device includes a switching circuit. The switching circuit includes: a multilayer wiring board including a first wiring layer and a second wiring layer; a first transistor and a second transistor mounted on the first wiring layer side of the multilayer wiring board; and a capacitor mounted on the second wiring layer side of the multilayer wiring board. When the multilayer wiring board is viewed in a plan view, a third via conductor is arranged in an area not overlapping a straight-line path connecting a source electrode of the first transistor with a drain electrode of the second transistor in a second wire.

8 Claims, 11 Drawing Sheets

LIQUID EJECTION DEVICE AND PRINTING DEVICE

This application claims the benefit of Japanese Patent Application No. 2013-62926, filed on Mar. 25, 2013. The content of the aforementioned application is incorporated herein by reference in its entirety.

BACKGROUND

1. Technical Field

The present invention relates to a liquid ejection device, a printing device, and the like.

2. Related Art

Like an ejection head mounted on an inkjet printer, there are many actuators composed of a capacitive load such as a piezoelectric element. For driving the actuator as a capacitive load, a drive signal at a certain level of power is needed. Therefore, the drive signal is generated by power-amplifying a drive waveform signal as the source of the drive signal. In this case, when an analog drive waveform signal is power-amplified in an analog manner to directly generate an analog drive signal, power efficiency is reduced because a large power loss occurs. Therefore, a technique of performing power amplification using a so-called class-D amplifier has been proposed.

When using a switching circuit such as a class-D amplifier, a bypass capacitor is generally arranged between a power supply potential and a ground potential for suppressing the ringing of output voltage (for example, JP-A-2011-187809 (Patent Document 1)). In inkjet printers, the occurrence of ringing leads to the occurrence of EMI noise. As a result, the discharge amount of ink varies, which is obstructive to an improvement in print quality.

It is important for suppressing the ringing to reduce the wire impedance of a loop formed of two transistors and a bypass capacitor that constitute a switching circuit. In a multilayer wiring board shown in FIGS. 1 and 2 of Patent Document 1, a wire has to be routed around via conductors, which is a cause of increasing the wire impedance of the loop formed of the two transistors and the bypass capacitor that constitute the switching circuit. For this reason, when the multilayer wiring board disclosed in Patent Document 1 is used for a printing device or the like, there are limitations to suppress ringing, that is, to improve print quality.

SUMMARY

An advantage of some aspects of the invention is to provide a liquid ejection device that can accurately discharge a liquid, a printing device, and the like.

Application Example 1

This application example is directed to a liquid ejection device including a switching circuit, the switching circuit including: a multilayer wiring board including a first wiring layer and a second wiring layer; a first transistor and a second transistor mounted on the first wiring layer side of the multilayer wiring board; and a capacitor mounted on the second wiring layer side of the multilayer wiring board, wherein the multilayer wiring board includes a first wire, a second wire, and a third wire formed in the first wiring layer, a fourth wire, a fifth wire, and a sixth wire formed in the second wiring layer, a first via conductor electrically connecting the first wire with the fourth wire, a second via conductor electrically connecting the third wire with the fifth wire, and a third via conductor electrically connecting the second wire with the sixth wire, a drain electrode of the first transistor is electrically connected with the first wire, a source electrode of the first transistor is electrically connected with the second wire, a drain electrode of the second transistor is electrically connected with the second wire, a source electrode of the second transistor is electrically connected with the third wire, a first electrode of the capacitor is electrically connected with the fourth wire, a second electrode of the capacitor is electrically connected with the fifth wire, and when the multilayer wiring board is viewed in a plan view, the third via conductor is arranged in an area not overlapping a straight-line path connecting the source electrode of the first transistor with the drain electrode of the second transistor in the second wire.

According to this application example, since the third via conductor is arranged in the area not overlapping the straight-line path connecting the source electrode of the first transistor with the drain electrode of the second transistor in the second wire, the fourth wire or the fifth wire electrically connected with the capacitor does not have to be routed around the third via conductor. Hence, it is possible to reduce the wire impedance of a loop formed of the first transistor, the second transistor, and the capacitor. Due to this, the ringing of the output voltage of the switching circuit can be suppressed. Hence, it is possible to realize the liquid ejection device that can accurately discharge a liquid.

Application Example 2

In the liquid ejection device according to the application example described above, it is preferable that when the multilayer wiring board is viewed in the plan view, at least a portion of the fourth wire or the fifth wire is arranged so as to overlap the straight-line path connecting the source electrode of the first transistor with the drain electrode of the second transistor in the second wire.

According to this application example, currents in opposite directions generally flow in the area where the second wire and the fourth wire or the fifth wire overlap each other. Hence, due to the effect of mutual inductance, the parasitic inductance becomes small. Due to this, the ringing of the output voltage of the switching circuit can be suppressed. Hence, it is possible to realize the liquid ejection device that can accurately discharge a liquid.

Application Example 3

In the liquid ejection device according to the application example described above, it is preferable that when the multilayer wiring board is viewed in the plan view, the capacitor is arranged at a position closer to the second transistor than the first transistor.

In many cases, the drain electrode of a transistor is formed to be larger in size than the source electrode. Therefore, heat generated by the transistor is released to the multilayer wiring board mainly via the drain electrode. According to this application example, the capacitor is arranged at the position closer to the second transistor than the first transistor, and therefore arranged at a position far from the drain electrode of the first transistor. Hence, the capacitor is less susceptible to the influence of heat generation of the first transistor.

Application Example 4

In the liquid ejection device according to the application example described above, it is preferable that the multilayer wiring board further includes a seventh wire formed in the first wiring layer, that a gate electrode of the first transistor is electrically connected with the seventh wire, and that when the multilayer wiring board is viewed in the plan view, the sixth wire and the seventh wire are formed at positions where at least a portion of the sixth wire and at least a portion of the seventh wire overlap each other.

In the area where the sixth wire and the seventh wire overlap each other, currents in opposite directions generally flow. According to this application example, the sixth wire and the seventh wire are formed at the positions where at least a portion of the sixth wire and at least a portion of the seventh wire overlap each other. Therefore, due to the effect of mutual inductance, the parasitic inductance becomes small. Due to this, the ringing of the output voltage of the switching circuit can be suppressed. Hence, it is possible to realize the liquid ejection device that can accurately discharge a liquid.

Application Example 5

In the liquid ejection device according to the application example described above, it is preferable that the multilayer wiring board further includes an eighth wire formed in the first wiring layer, that a gate electrode of the second transistor is electrically connected with the eighth wire, and that when the multilayer wiring board is viewed in the plan view, the fifth wire and the eighth wire are formed at positions where at least a portion of the fifth wire and at least a portion of the eighth wire overlap each other.

In the area where the fifth wire and the eighth wire overlap each other, currents in opposite directions generally flow. According to this application example, the fifth wire and the eighth wire are formed at the positions where at least a portion of the fifth wire and at least a portion of the eighth wire overlap each other. Therefore, due to the effect of mutual inductance, the parasitic inductance becomes small. Due to this, the ringing of the output voltage of the switching circuit can be suppressed. Hence, it is possible to realize the liquid ejection device that can accurately discharge a liquid.

Application Example 6

This application example is directed to a printing device including any of the liquid ejection devices described above.

According to this application example, since the liquid ejection device that can accurately discharge a liquid is included, it is possible to realize the printing device with good print quality.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described in detail with reference to the drawings. The drawings used herein are for purposes of description. The embodiment described below does not unduly limit the contents of the invention set forth in the appended claims. Moreover, not all of the configurations described below are essential components of the invention.

Figure 1:
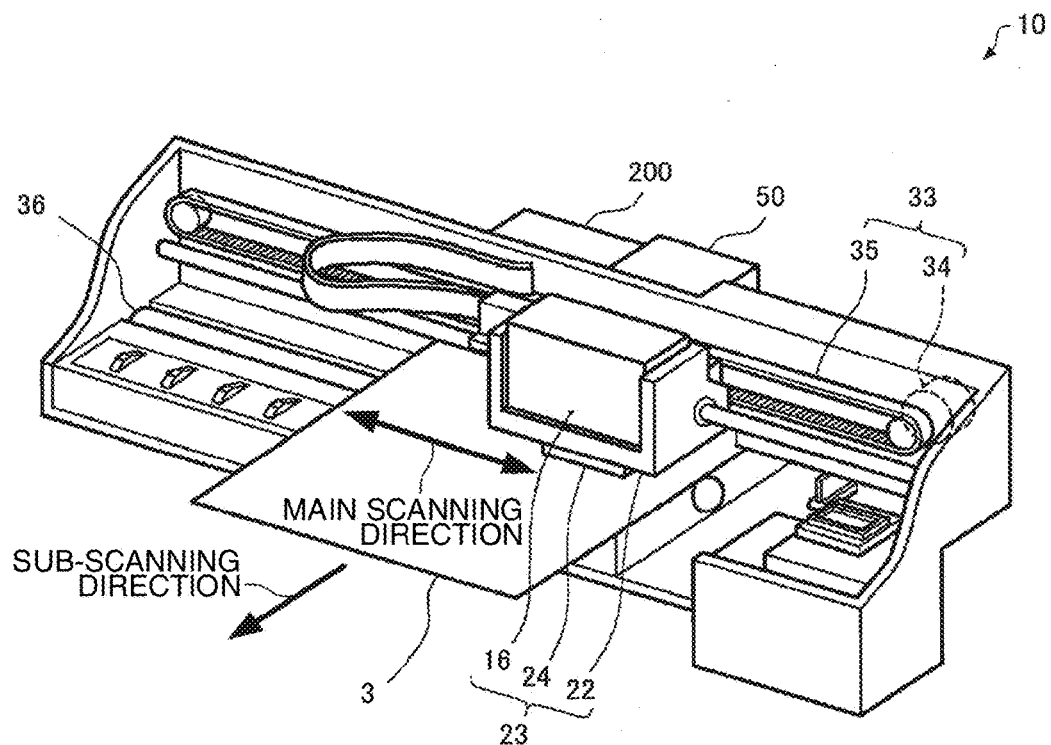
FIG. 1 is an explanatory view showing a configuration example of an inkjet printer as an example of a printing device.

The embodiment of the invention will be described below in the following order.
1. Configuration example of printing device and liquid ejection device
2. Circuit configuration of capacitive load drive circuit
3. Arrangement example of switching circuit
4. Modified example of arrangement example of switching circuit
5. Medical device 1. Configuration Example of Printing Device and Liquid Ejection Device FIG. 1 is an explanatory view showing a configuration example of an inkjet printer 10 as an example of a printing device. The inkjet printer 10 shown in FIG. 1 includes a carriage 23 that forms an ink dot on a print medium 3 while reciprocating in a main scanning direction, a drive mechanism 33 that makes the carriage 23 reciprocate, and a platen roller 36 for feeding the print medium 3. The carriage 23 is provided with an ink cartridge 16 that contains ink, a carriage case 22 into which the ink cartridge 16 is loaded, an ejection head 24 that is mounted on the bottom surface side (side facing the print medium 3) of the carriage case 22 to eject ink, and the like. The ink in the ink cartridge 16 is guided to the ejection head 24, and ejected from the ejection head 24 onto the print medium 3, so that an image is printed.

The drive mechanism 33 that makes the carriage 23 reciprocate includes a timing belt 35 that is stretched by a pulley, and a step motor 34 that drives the timing belt 35 via the pulley. A portion of the timing belt 35 is fixed to the carriage case 22. By driving the timing belt 35, the carriage case 22 can be reciprocated. The platen roller 36 constitutes, together with a not-shown drive motor or gear mechanism, a sheet feeding mechanism that feeds the print medium 3, and can feed the print medium 3 in a sub-scanning direction by a predetermined amount.

On the inkjet printer 10, a printer control circuit 50 that controls the overall operation, and a capacitive load drive circuit 200 for driving the ejection head 24 are also mounted. The printer control circuit 50 controls the overall operation of the capacitive load drive circuit 200, the drive mechanism 33, the sheet feeding mechanism, and the like to drive the ejection head 24 to eject ink while feeding the print medium 3.

Figure 2:
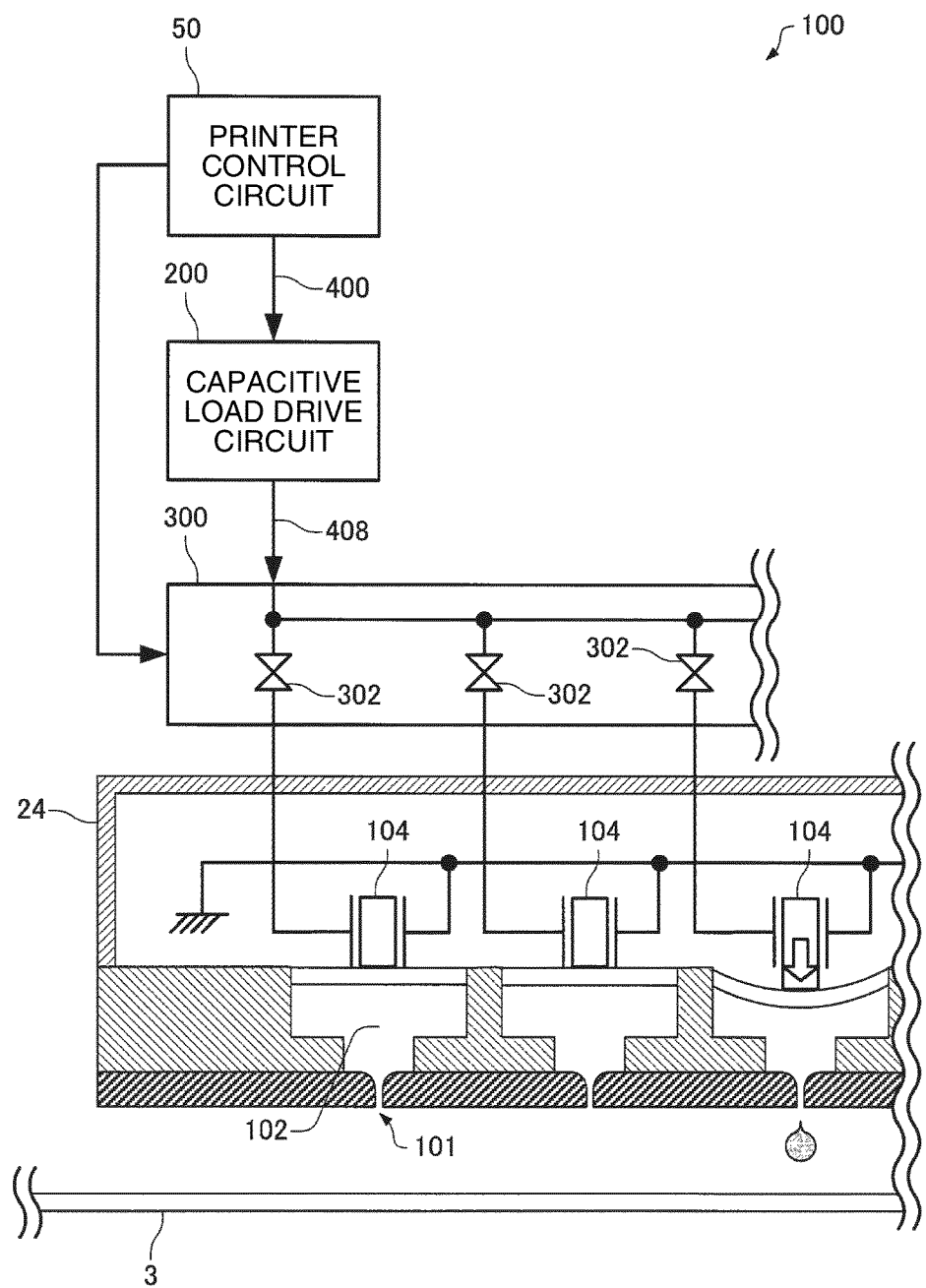
FIG. 2 is an explanatory view showing a configuration example of a liquid ejection device included in the inkjet printer.

FIG. 2 is an explanatory view showing a configuration example of a liquid ejection device 100 included in the inkjet printer 10. FIG. 2 shows a state where the capacitive load drive circuit 200 drives the ejection head 24 under the control of the printer control circuit 50. First of all, the internal structure of the ejection head 24 will be briefly described. As shown in the drawing, a plurality of ejection ports 101 for ejecting ink drops are provided in the bottom surface of the ejection head 24 facing the print medium 3. The ejection ports 101 are connected respectively to ink chambers 102. The ink chamber 102 is filled with ink supplied from the ink cartridge 16. A piezo element 104 is provided above each of the ink chambers 102. When a voltage is applied to the piezo element 104, the piezo element 104 is deformed to pressurize the ink chamber 102, so that the ink is ejected through the ejection port 101. The deformation amount of the piezo element 104 varies depending on the voltage value to be applied to the piezo element 104. A proper voltage waveform is applied to the piezo element 104 to control the deformation amount or timing of the ink chamber 102, so that a proper amount of ink can be ejected at proper timing.

A drive signal 408 as a voltage to be applied to the piezo element 104 is generated by the capacitive load drive circuit 200 based on a control signal 400 from the printer control circuit 50. The generated drive signal 408 is supplied to the piezo element 104 via a gate unit 300. The gate unit 300 is a circuit unit including a plurality of gate elements 302 connected in parallel. The gate elements 302 can be individually brought into a conductive state or a cut-off state under the control from the printer control circuit 50. Hence, the drive signal 408 output from the capacitive load drive circuit 200 transmits through the gate element 302 previously set by the printer control circuit 50 into the conductive state, and is applied to the corresponding piezo element 104, so that the ink is ejected through the ejection port 101 corresponding to the piezo element 104.

2. Circuit Configuration of Capacitive Load Drive Circuit

Figure 3:
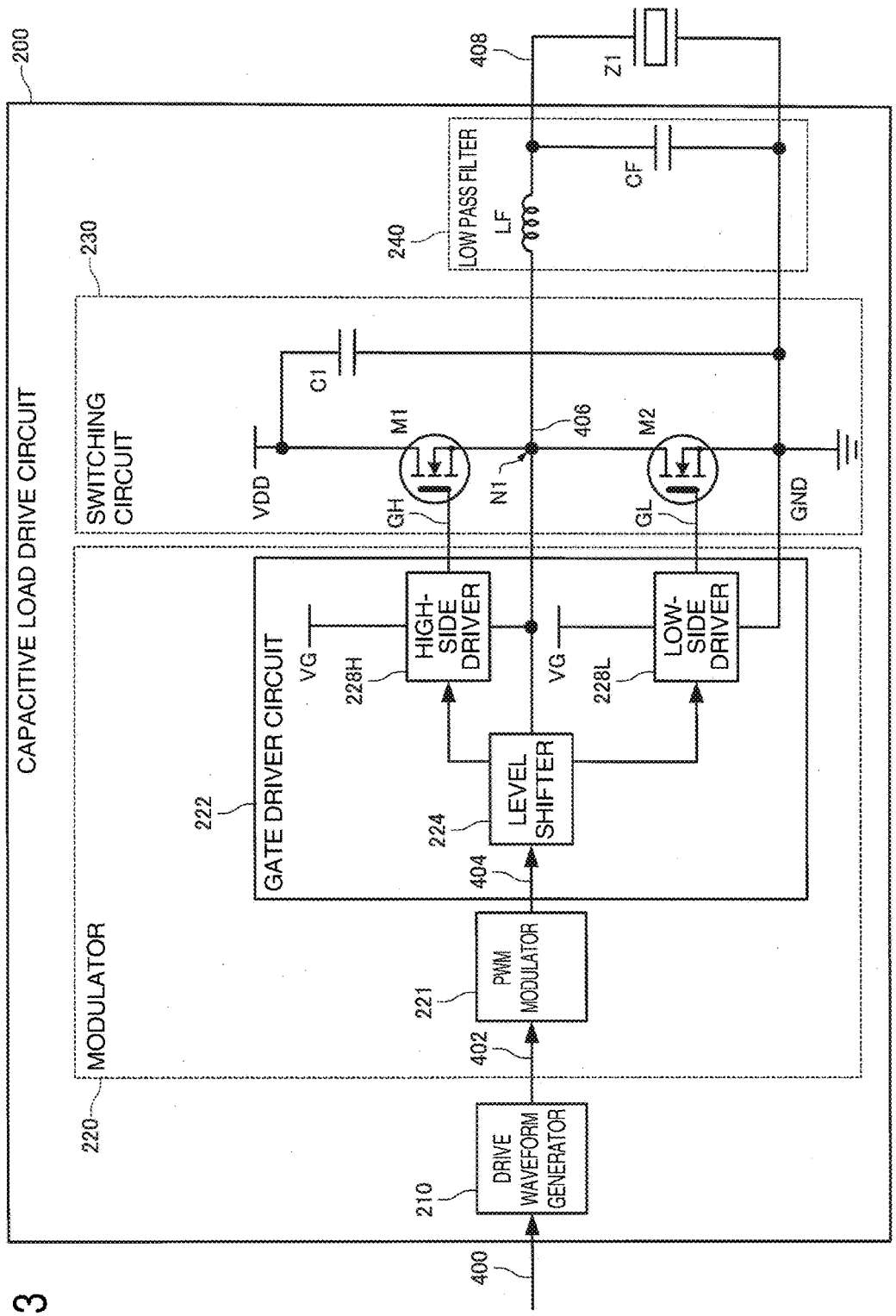
FIG. 3 is an explanatory view showing a detailed configuration of a capacitive load drive circuit of an embodiment.

FIG. 3 is an explanatory view showing the detailed configuration of the capacitive load drive circuit 200 of the embodiment. As shown in the drawing, the capacitive load drive circuit 200 is configured to include a drive waveform generator 210 that generates a drive waveform signal 402, a modulator 220 that pulse-modulates the drive waveform signal 402 to generate a modulated signal GH and a modulated signal GL, a switching circuit 230 that accepts the modulated signal GH and the modulated signal GL to generate an amplified digital signal 406 as a signal obtained by power-amplifying the modulated signal GH and the modulated signal GL, and a low pass filter 240 that smoothes the amplified digital signal 406 to generate the drive signal 408. A capacitive load Z1 to which the drive signal 408 is applied corresponds to the piezo element 104 shown in FIG. 2.

The drive waveform generator 210 generates, based on the control signal 400, the drive waveform signal 402 as a reference of the drive signal 408.

The modulator 220 is configured to include a PWM modulator 221 that performs PWM-modulation (pulse-width modulation) on the drive waveform signal 402 to generate a PWM modulated signal 404, and a gate driver circuit 222 that generates the modulated signal GH and the modulated signal GL based on the PWM modulated signal 404.

The gate driver circuit 222 is configured to include a level shifter 224 that adjusts the level of the PWM modulated signal 404, a high-side driver 228H that switches ON/OFF of a first transistor M1 based on the PWM modulated signal 404 via the level shifter 224, and a low-side driver 228L that switches ON/OFF of a second transistor M2 based on the PWM modulated signal 404 via the level shifter 224.

A signal output from the high-side driver 228H to switch ON/OFF of the first transistor M1 is the modulated signal GH, while a signal output from the low-side driver 228L to switch ON/OFF of the second transistor M2 is the modulated signal GL.

The switching circuit 230 is configured as a digital power amplifier including the first transistor M1 and the second transistor M2 that generate the amplified digital signal 406, and a capacitor C1 that functions as a bypass capacitor. In the capacitive load drive circuit 200 of the embodiment, the first transistor M1 and the second transistor M2 are each an N-type MOSFET. However, another kind of element such as an insulated gate bipolar transistor (IGBT) may be used. Examples of switching circuits to which the invention is applied include various kinds of switching circuits including a switching amplifier circuit, a switching power supply circuit, a motor drive circuit, and an inverter circuit.

As shown in FIG. 3, the first transistor M1 and the second transistor M2 are connected between a potential VDD (hereinafter referred to simply as VDD) supplied from a power supply and a ground potential GND (hereinafter referred to simply as GND). By switching ON/OFF of the first transistor M1 and the second transistor M2, the amplified digital signal 406 is generated. A contact point (node) where the first transistor M1 and the second transistor M2 are connected together is a first node N1. The first node N1 is located on a wire through which the amplified digital signal 406 passes. The capacitor C1 is connected between VDD and GND.

The low pass filter 240 removes a high-frequency component of the amplified digital signal 406 to generate the drive signal 408. In the example shown in FIG. 3, the low pass filter 240 is configured as a low-pass filter including a coil LF and a capacitor CF.

Figure 4:
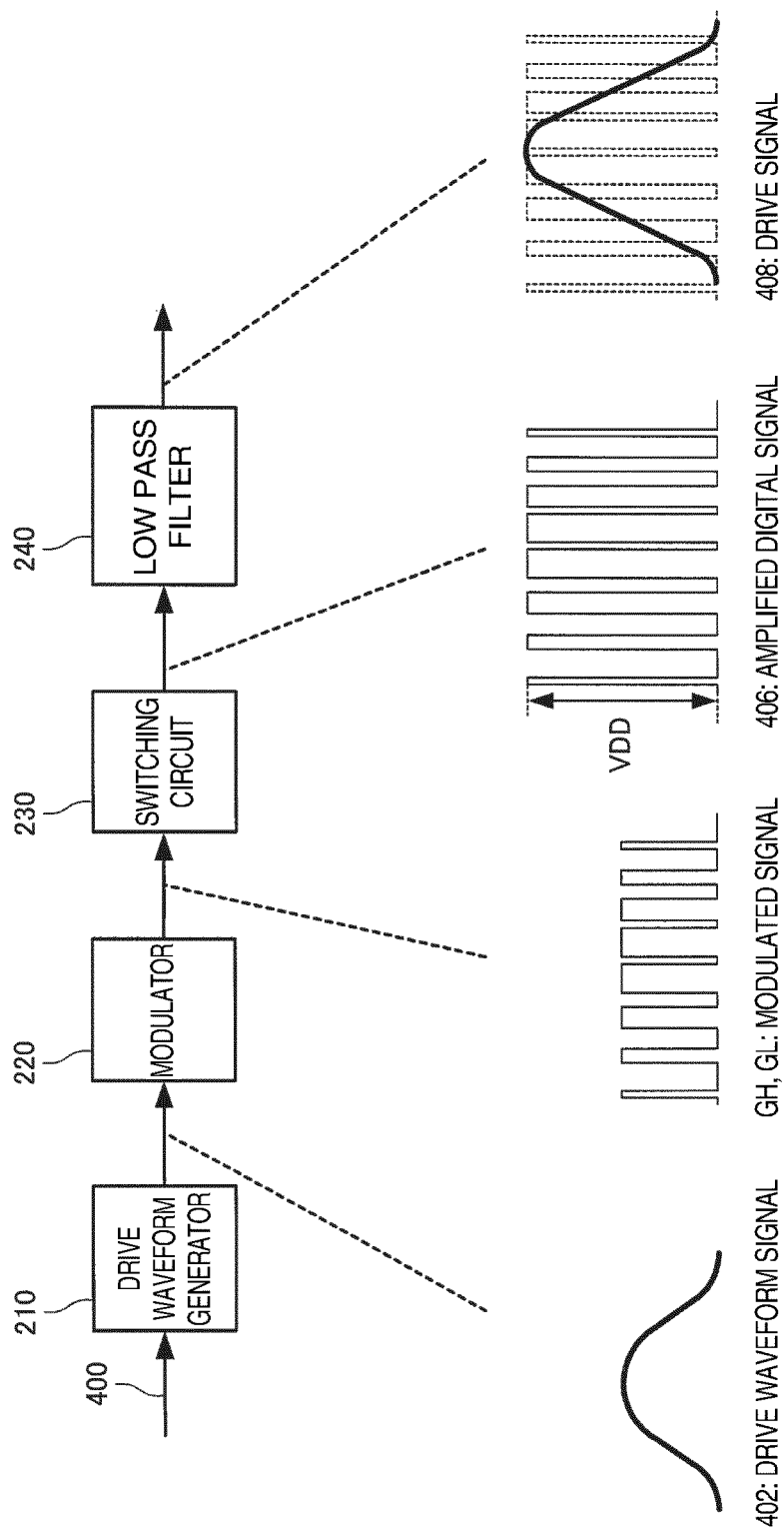
FIG. 4 is an explanatory view showing the outline of operation of the capacitive load drive circuit to generate a drive signal.

FIG. 4 is an explanatory view showing the outline of operation of the capacitive load drive circuit 200 to generate the drive signal 408. The drive waveform generator 210 generates, for example, the drive waveform signal 402 shown in FIG. 4 based on the control signal 400. The drive waveform signal 402 is not limited to an analog signal shown in FIG. 4, and may be, for example, a signal output at DC level or a multibit digital signal.

The drive waveform generator 210 may include, for example, an operator, and generate the drive waveform signal 402 through arithmetic operation based on the control signal 400. Moreover, the drive waveform generator 210 may include, for example, a waveform memory that stores waveforms, and generate the drive waveform signal 402 corresponding to the control signal 400 with reference to the waveform memory.

When accepting the drive waveform signal 402 from the drive waveform generator 210, the modulator 220 performs predetermined modulation to generate the modulated signal GH and the modulated signal GL. The predetermined modulation is pulse-width modulation (PWM) in the embodiment. However, another modulation method such as pulse-density modulation (PDM) may be used.

The switching circuit 230 accepts the modulated signal GH and the modulated signal GL and performs power amplification. As shown in FIG. 3, the switching circuit 230 amplifies power using the first transistor M1 and the second transistor M2. In the example shown in FIG. 4, the switching circuit 230 generates the amplified digital signal 406 that is obtained by amplifying the voltage of the PWM modulated signal 404 to VDD.

Then, the low pass filter 240 smoothes the amplified digital signal 406 to generate the drive signal 408 in an analog form where a portion modulated into a wide pulse width has a high voltage value and a portion modulated into a narrow pulse width has a low voltage value. As shown in FIG. 3, the low pass filter 240 can be easily realized by combining the coil LF and the capacitor CF.

In the capacitive load drive circuit 200 of the embodiment, since power is amplified by switching ON/OFF of the first transistor M1 and the second transistor M2 in the switching circuit 230, unnecessary power is not consumed. Moreover, the low pass filter 240 can be composed of components with less power consumption such as the coil LF and the capacitor CF. For this reason, power loss can be greatly reduced compared to the case where the drive waveform signal 402 in an analog form is power-amplified as analog like a so-called analog amplifier circuit. Therefore, power loss when generating the drive signal 408 can be greatly reduced.

In the switching circuit 230 described above, the ringing of output voltage is a problem in some cases. The occurrence of ringing causes EMI noise, which is obstructive to the operation of the device itself or peripheral equipment. When the rise time of a switching waveform is increased for suppressing the ringing, power efficiency is reduced, or the accuracy of fluid control is reduced. Moreover, the occurrence of ringing increases a voltage to be applied to the first transistor M1 and the second transistor M2, which causes an element breakdown or malfunction.

Factors causing the ringing include the resonance phenomenon due to the parasitic resistance and parasitic inductance of an electrical loop including the first transistor M1, the second transistor M2, and the capacitor C1 and the parasitic capacitance between the drain and source of the first transistor M1 or the second transistor M2, the resonance phenomenon due to the parasitic inductance of an electrical loop including the high-side driver 228H and the first transistor M1 and the gate capacitance of the first transistor M1, and the resonance phenomenon due to the parasitic inductance of an electrical loop including the low-side driver 228L and the second transistor M2 and the gate capacitance of the second transistor M2.

Hence, when arranging elements or wires constituting the switching circuit 230, it is especially important to reduce the wire impedance (parasitic resistance and parasitic inductance) of an electrical loop.

3. Arrangement Example of Switching Circuit

The switching circuit 230 in the embodiment is configured to include a multilayer wiring board 1000 including a first wiring layer and a second wiring layer, the first transistor M1 and the second transistor M2 mounted on the first wiring layer side of the multilayer wiring board 1000, and the capacitor C1 mounted on the second wiring layer side of the multilayer wiring board 1000.

Figure 5A:
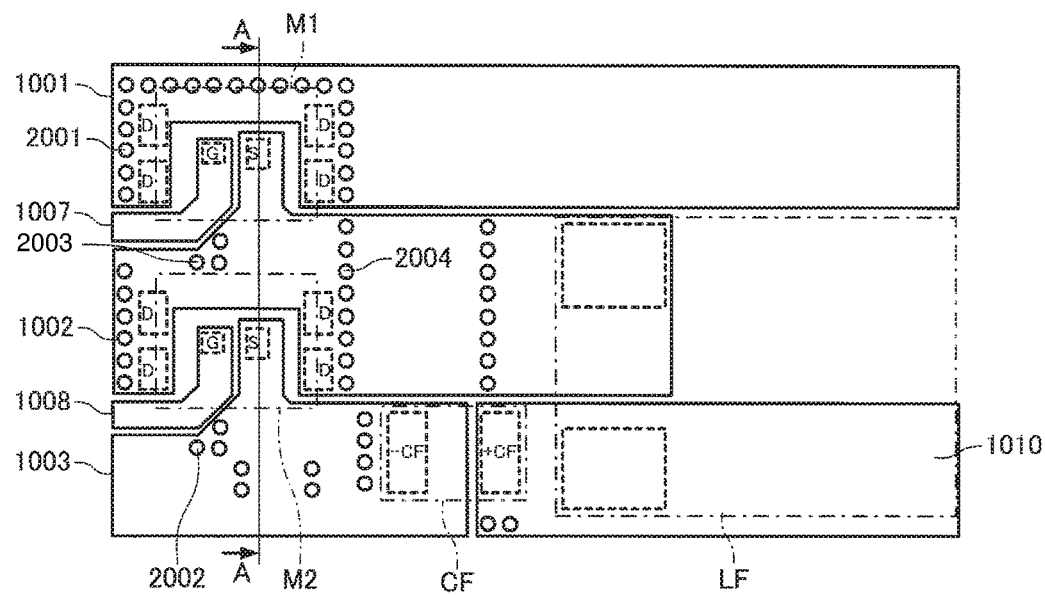
FIGS. 5A and 5B are plan views showing an arrangement example of a switching circuit.
Figure 5B:
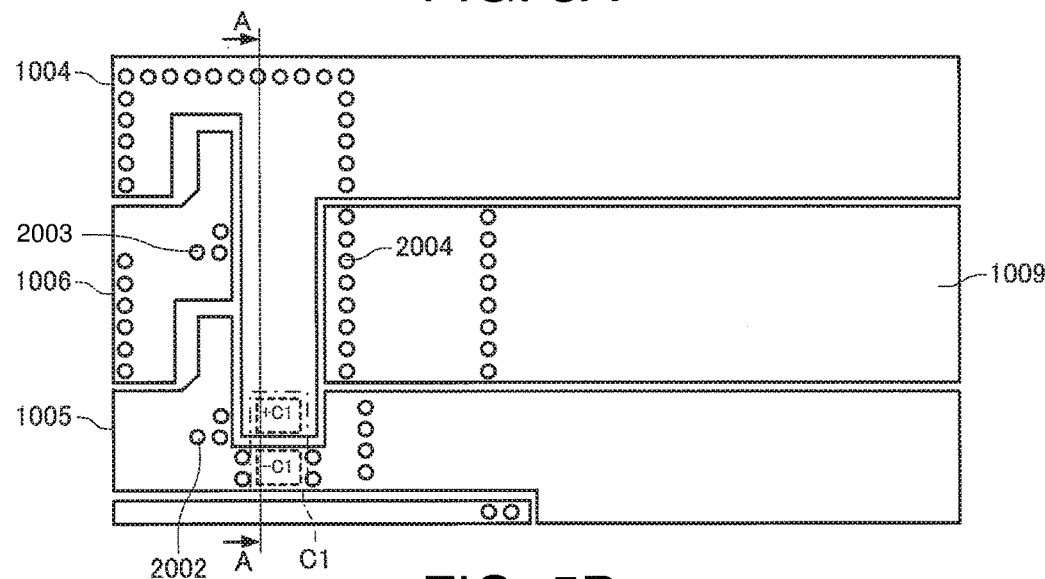

FIGS. 5A and 5B are plan views showing an arrangement example of the switching circuit 230. FIG. 5A mainly shows the configuration of the first wiring layer. FIG. 5B mainly shows the configuration of the second wiring layer. In FIGS. 5A and 5B, the solid-line polygons indicate wires formed in the first wiring layer or the second wiring layer, while the solid-line circles indicate the positions of via conductors that electrically connect the wires of the first wiring layer with the wires of the second wiring layer. Also in FIGS. 5A and 5B, the dash-dotted lines indicate the mounting positions of the transistors, capacitors, and coil, while the dashed lines indicate the positions of electrodes of the transistors, capacitors, and coil.

Figure 6:
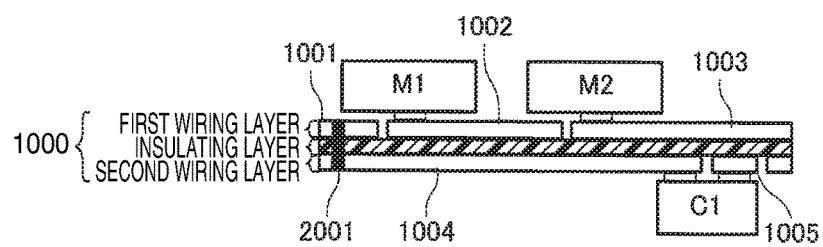
FIG. 6 is a cross-sectional view taken along the line A-A in FIGS. 5A and 5B.

FIG. 6 is a cross-sectional view taken along the line A-A in FIGS. 5A and 5B. As shown in FIG. 6, an insulating layer is provided between the first wiring layer and the second wiring layer of the multilayer wiring board 1000. That is, the wires formed in the first wiring layer and the wires formed in the second wiring layer are insulated from each other, excepting the case where the wires are connected by means of the via conductor. In general, the thickness of the insulating layer is sufficiently smaller than the wire width. The multilayer wiring board 1000 may include three or more wiring layers, and any two wiring layers selected from the three or more wiring layers may be used as the first wiring layer and the second wiring layer. The first wiring layer and the second wiring layer are preferably closest to each other. The multilayer wiring board 1000 may include a protective layer that protects the wiring layer.

As shown in FIGS. 5A and 5B, the multilayer wiring board 1000 in the embodiment is configured to include a first wire 1001, a second wire 1002, and a third wire 1003 that are formed in the first wiring layer, a fourth wire 1004, a fifth wire 1005, and a sixth wire 1006 that are formed in the second wiring layer, first via conductors 2001 that electrically connect the first wire 1001 with the fourth wire 1004, second via conductors 2002 that electrically connect the third wire 1003 with the fifth wire 1005, and third via conductors 2003 that electrically connect the second wire 1002 with the sixth wire 1006.

A drain electrode D of the first transistor M1 is electrically connected with the first wire 1001. A source electrode S of the first transistor M1 is electrically connected with the second wire 1002. A drain electrode D of the second transistor M2 is electrically connected with the second wire 1002. A source electrode S of the second transistor M2 is electrically connected with the third wire 1003. A first electrode +C1 of the capacitor C1 is electrically connected with the fourth wire 1004. A second electrode −C1 of the capacitor C1 is electrically connected with the fifth wire 1005.

That is, a portion of a wiring path from the drain electrode D of the first transistor M1 to the first electrode +C1 of the capacitor C1 is formed as the fourth wire 1004 of the second wiring layer. Moreover, a portion of a wiring path from the source electrode S of the second transistor M2 to the second electrode −C1 of the capacitor C1 is formed as the fifth wire 1005 of the second wiring layer.

When the multilayer wiring board 1000 is viewed in a plan view, the third via conductors 2003 are arranged in an area not overlapping a straight-line path connecting the source electrode S of the first transistor M1 with the drain electrode D of the second transistor M2 in the second wire 1002. The straight-line path connecting the source electrode S of the first transistor M1 with the drain electrode D of the second transistor M2 in the second wire 1002 is a dominant path as the path of current flowing between the source electrode S of the first transistor M1 and the drain electrode D of the second transistor M2.

According to the embodiment, since the third via conductors 2003 are arranged in the area not overlapping the straight-line path connecting the source electrode S of the first transistor M1 with the drain electrode D of the second transistor M2 in the second wire 1002, the fourth wire 1004 or the fifth wire 1005 that is electrically connected with the capacitor C1 does not have to be routed around the third via conductors 2003. Hence, the wire impedance of the loop formed of the first transistor M1, the second transistor M2, and the capacitor C1 can be reduced. Due to this, the ringing of the output voltage of the switching circuit 230 can be suppressed. Hence, it is possible to realize the liquid ejection device 100 that can accurately discharge a liquid.

In the example shown in FIGS. 5A and 5B, when the multilayer wiring board 1000 is viewed in the plan view, at least a portion of the fourth wire 1004 or the fifth wire 1005 is arranged so as to overlap the straight-line path connecting the source electrode S of the first transistor M1 with the drain electrode D of the second transistor M2 in the second wire 1002. In the example shown in FIGS. 5A and 5B, when the multilayer wiring board 1000 is viewed in the plan view, especially a portion of the fourth wire 1004 is arranged so as to overlap the straight-line path connecting the source electrode S of the first transistor M1 with the drain electrode D of the second transistor M2 in the second wire 1002.

Figure 7:
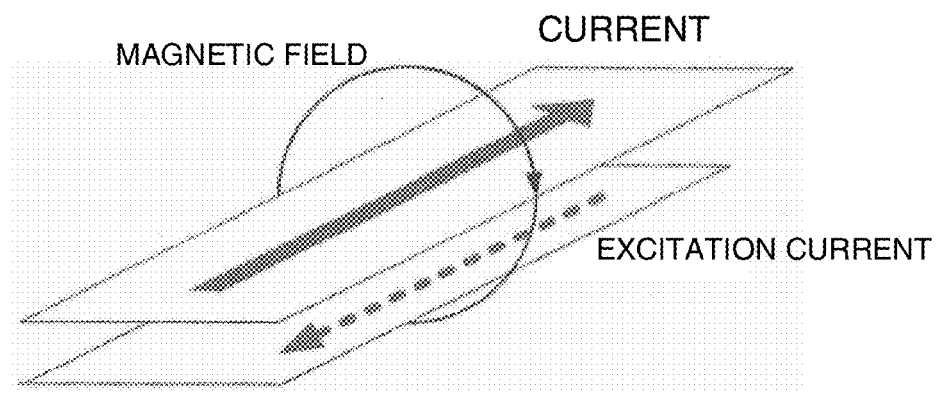
FIG. 7 explains a parasitic inductance.

FIG. 7 explains a parasitic inductance. In FIG. 7, two wires provided spaced apart from each other are illustrated. When current flows through one of the wires, a counter-electromotive force is generated in a direction of cancelling a magnetic field produced by the current itself. When the two wires are provided in proximity to each other, a counter-electromotive force is generated also in the other wire in the direction of cancelling the magnetic field produced by the current flowing through the one wire (effect of mutual inductance). Hence, by wiring the two wires such that the currents flowing through the two wires flow in opposite directions, the parasitic inductance of the wire can be reduced.

According to the embodiment, in the area where the second wire 1002 overlaps the fourth wire 1004 or the fifth wire 1005, currents in opposite directions generally flow. Hence, due to the effect of mutual inductance, the parasitic inductance becomes small. Due to this, the ringing of the output voltage of the switching circuit 230 can be suppressed. Hence, it is possible to realize the liquid ejection device 100 that can accurately discharge a liquid.

In general, the thickness of the insulating layer is sufficiently smaller than the wire width. Therefore, even compared to the case where all wires are formed in the same wiring layer, it is possible to suppress an increase in the area of the electrical loop including the first transistor M1, the second transistor M2, and the capacitor C1. That is, an increase in parasitic inductance can be suppressed. Due to this, the ringing of the output voltage of the switching circuit 230 can be suppressed. Hence, it is possible to realize the liquid ejection device 100 that can accurately discharge a liquid.

In the example shown in FIGS. 5A and 5B, when the multilayer wiring board 1000 is viewed in the plan view, the capacitor C1 is arranged at a position closer to the second transistor M2 than the first transistor M1.

In many cases, the drain electrode of a transistor is formed to be larger in size than the source electrode. Therefore, heat generated by the transistor is released to the multilayer wiring board 1000 mainly via the drain electrode. According to the embodiment, the capacitor C1 is arranged at the position closer to the second transistor M2 than the first transistor M1, and therefore arranged at a position far from the drain electrode D of the first transistor M1. Hence, the capacitor C1 is less susceptible to the influence of heat generation of the first transistor M1.

In the example shown in FIGS. 5A and 5B, the multilayer wiring board 1000 further includes a seventh wire 1007 formed in the first wiring layer. A gate electrode G of the first transistor M1 is electrically connected with the seventh wire 1007. When the multilayer wiring board 1000 is viewed in the plan view, the sixth wire 1006 and the seventh wire 1007 are formed at positions where at least a portion of the sixth wire 1006 and at least a portion of the seventh wire 1007 overlap each other.

In the area where the sixth wire 1006 and the seventh wire 1007 overlap each other, currents in opposite directions generally flow. According to the embodiment, since the sixth wire 1006 and the seventh wire 1007 are formed at the positions where at least a portion of the sixth wire 1006 and at least a portion of the seventh wire 1007 overlap each other, the parasitic inductance becomes small due to the effect of mutual inductance. Due to this, the ringing of the output voltage of the switching circuit 230 can be suppressed. Hence, it is possible to realize the liquid ejection device 100 that can accurately discharge a liquid.

In the example shown in FIGS. 5A and 5B, the multilayer wiring board 1000 further includes an eighth wire 1008 formed in the first wiring layer. A gate electrode G of the second transistor M2 is electrically connected with the eighth wire 1008. When the multilayer wiring board 1000 is viewed in the plan view, the fifth wire 1005 and the eighth wire 1008 are formed at positions where at least a portion of the fifth wire 1005 and at least a portion of the eighth wire 1008 overlap each other.

In the area where the fifth wire 1005 and the eighth wire 1008 overlap each other, currents in opposite directions generally flow. According to the embodiment, since the fifth wire 1005 and the eighth wire 1008 are formed at the positions where at least a portion of the fifth wire 1005 and at least a portion of the eighth wire 1008 overlap each other, the parasitic inductance becomes small due to the effect of mutual inductance. Due to this, the ringing of the output voltage of the switching circuit 230 can be suppressed. Hence, it is possible to realize the liquid ejection device 100 that can accurately discharge a liquid.

In the example shown in FIGS. 5A and 5B, the multilayer wiring board 1000 further includes a ninth wire 1009 formed in a wiring layer other than the first wiring layer, and fourth via conductors 2004 that electrically connect the second wire 1002 with the ninth wire 1009.

According to the embodiment, since the ninth wire 1009 that is electrically connected with the second wire 1002 is formed in the wiring layer (for example, the second wiring layer) other than the first wiring layer, the ninth wire 1009 functions as a heat sink. Hence, the heat dissipation efficiency of the second transistor M2 can be improved.

In the example shown in FIGS. 5A and 5B, the multilayer wiring board 1000 further includes a tenth wire 1010 that is formed in the first wiring layer and electrically connected with a first electrode +CF (electrode on the positive potential side) of the capacitor CF. The fifth wire 1005 and the tenth wire 1010 are formed at positions where at least a portion of the fifth wire 1005 and at least a portion of the tenth wire 1010 overlap each other when the multilayer wiring board 1000 is viewed in the plan view.

When common mode noise is superimposed on an output signal of the capacitive load drive circuit 200, the component of common mode noise appears as current components in the same direction in the fifth wire 1005 and the tenth wire 1010. According to the embodiment, the fifth wire 1005 and the tenth wire 1010 are formed at the positions where at least a portion of the fifth wire 1005 and at least a portion of the tenth wire 1010 overlap each other. Therefore, due to the effect of mutual inductance described with reference to FIG. 7, the wire impedance with respect to the current components in the same direction that flow in the fifth wire 1005 and the tenth wire 1010 is increased, which acts so as to cancel the common mode noise. Hence, the common mode noise can be suppressed. Moreover, EMI noise caused by the common mode noise can be suppressed.

Figure 8A:
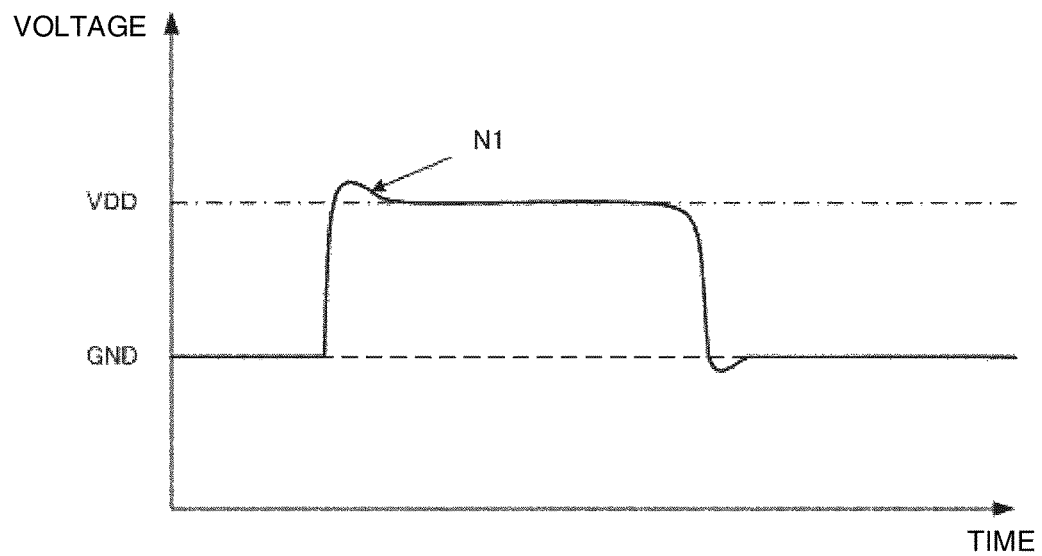
FIG. 8A is a graph showing an output voltage waveform example of the switching circuit of the embodiment.
Figure 8B:
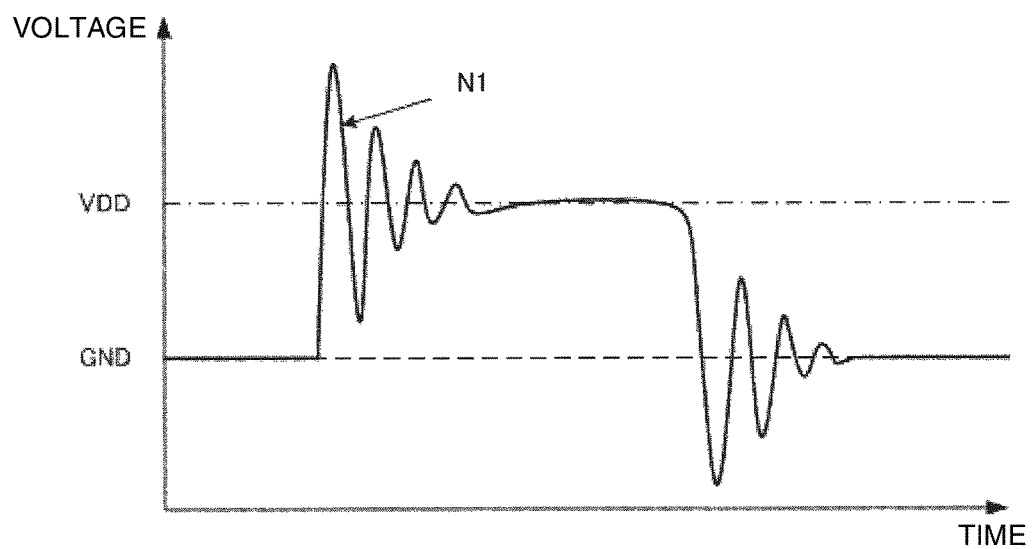
FIG. 8B is a graph showing an output voltage waveform example of a switching circuit of a comparative example.

FIG. 8A is a graph showing an output voltage waveform example of the switching circuit 230 of the embodiment. FIG. 8B is a graph showing an output voltage waveform example of a switching circuit of a comparative example. The switching circuit of the comparative example is a circuit in which all wires constituting the electrical loop including the first transistor M1, the second transistor M2, and the capacitor C1 are formed in the first wiring layer. The electrical connections of the switching circuit are the same as those of the circuit diagram shown in FIG. 3. The output voltage waveform is a voltage waveform measured at anode corresponding to the first node N1.

In the output voltage waveform example of the comparative example shown in FIG. 8B, large ringing occurs at the rising and falling edges of the voltage waveform. On the other hand, in the output voltage waveform example of the embodiment shown in FIG. 8A, the occurrence of ringing is reduced due to the various actions described above.

When the liquid ejection device 100 that can accurately discharge a liquid is applied to a printing device (the inkjet printer 10) as in the embodiment, a printing device with good print quality can be realized.

4. Modified Example of Arrangement Example of Switching Circuit

The same configurations as those of the embodiment described above are denoted by the same reference numerals and signs, and the detailed description is omitted. The circuit configuration of the capacitive load drive circuit 200 in the modified example is the configuration shown in FIG. 3.

Figure 9A:
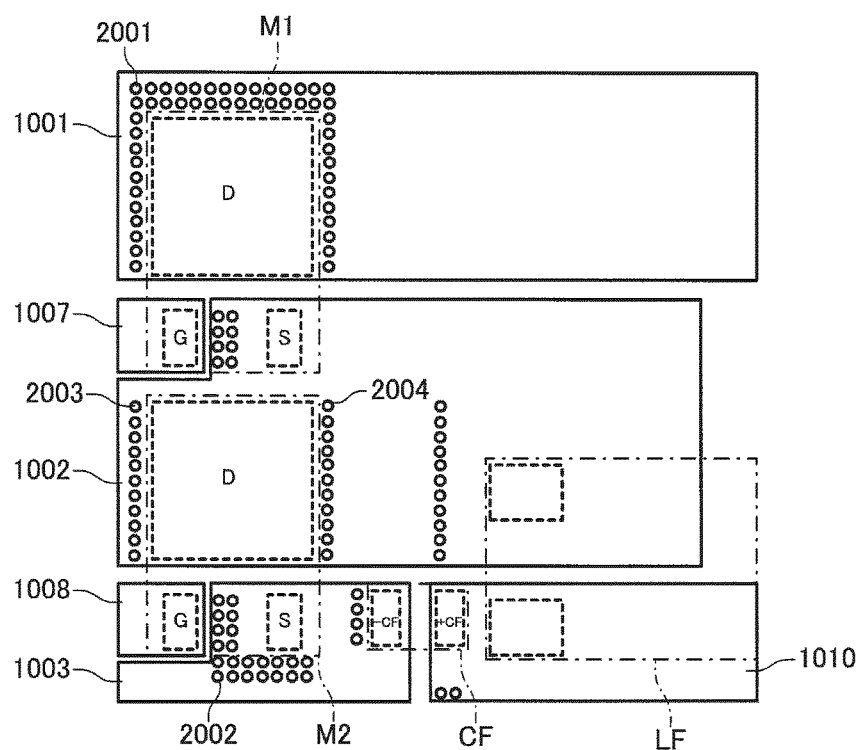
FIGS. 9A and 9B are plan views showing a modified example of an arrangement example of the switching circuit.
Figure 9B:
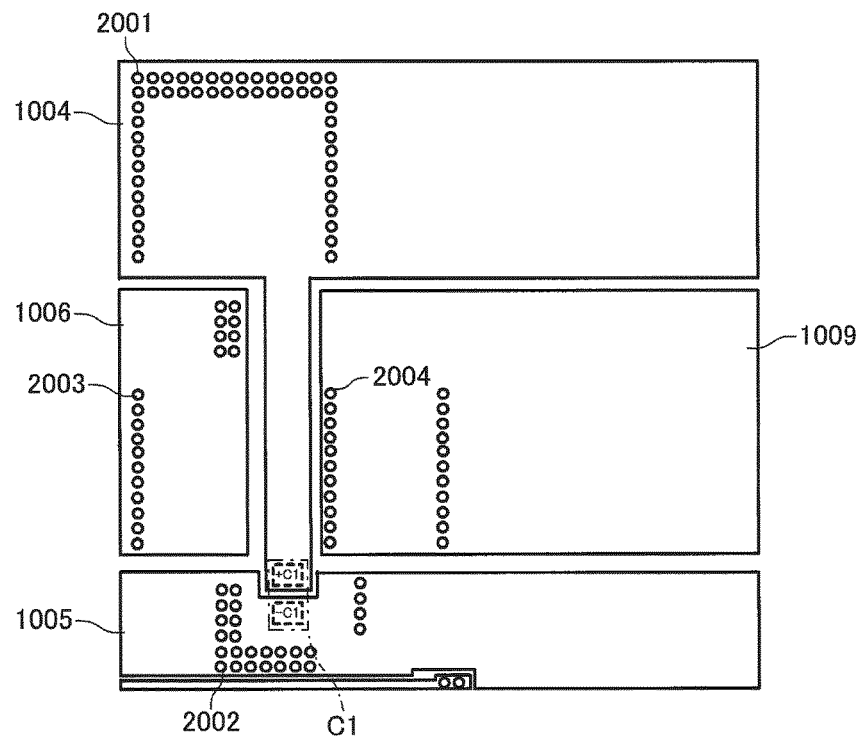

FIGS. 9A and 9B are plan views showing the modified example of the arrangement example of the switching circuit 230. FIG. 9A shows mainly the configuration of the first wiring layer. FIG. 9B shows mainly the configuration of the second wiring layer. In FIGS. 9A and 9B, the solid-line polygons indicate wires formed in the first wiring layer or the second wiring layer, while the solid-line circles indicate the positions of via conductors that electrically connect the wires of the first wiring layer with the wires of the second wiring layer. Also in FIGS. 9A and 9B, the dash-dotted lines indicate the mounting positions of the transistors, capacitors, and coil, while the dashed lines indicate the positions of electrodes of the transistors, capacitors, and coil.

Comparing the embodiment with the modified example, the arrangement of the electrodes of the first transistor M1 and the second transistor M2 is different, but the other configurations are the same.

Also in the configuration described above, similar advantageous effects are provided for reasons similar to those of the embodiment described above.

5. Medical Device

The capacitive load drive circuit 200 using the switching circuit 230 can be mounted on various medical devices to enhance the reliability of the medical devices. Both of a fluid ejection device 1 and a fluid transport device 20 described later are configuration examples included in the liquid ejection device.

Figure 10:
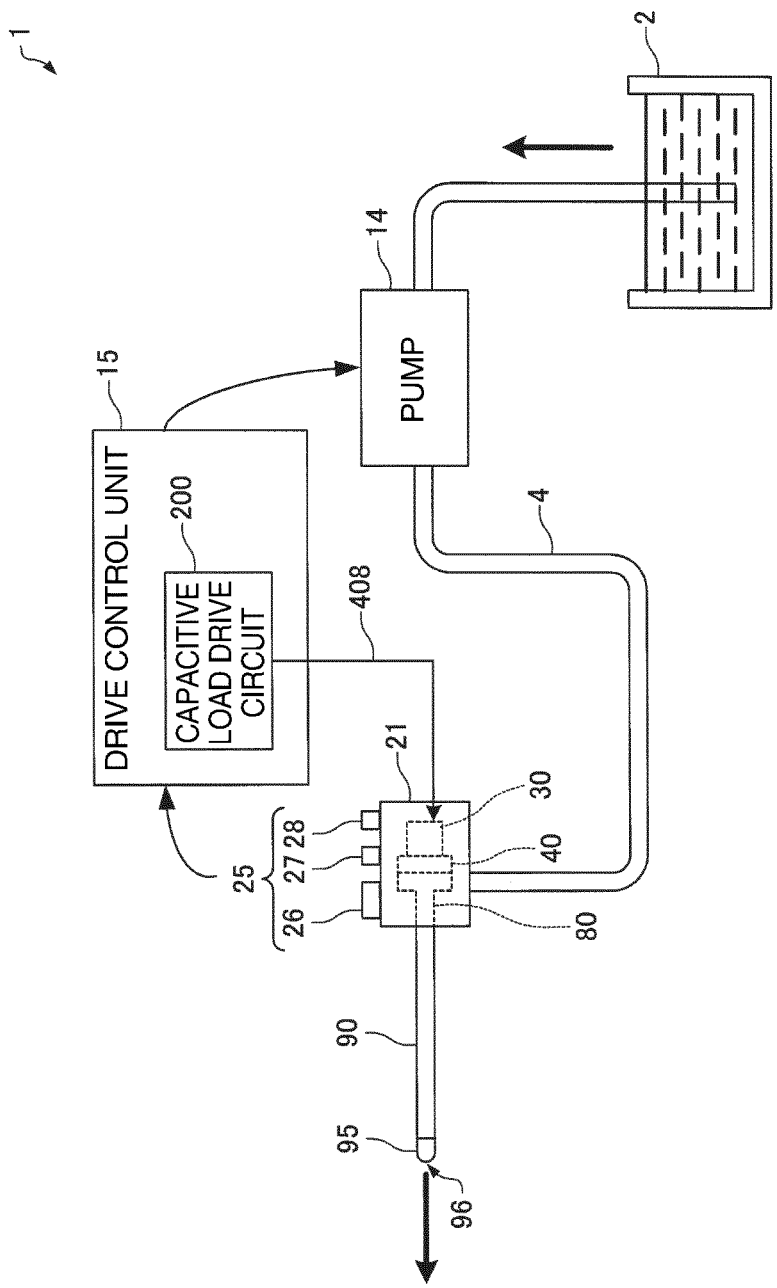
FIG. 10 is an explanatory view illustrating a fluid ejection device.

For example, the capacitive load drive circuit 200 can be applied as the fluid ejection device 1. FIG. 10 is an explanatory view illustrating the fluid ejection device 1. The fluid ejection device 1 can be adopted in various applications such as cleaning of minute objects and structures, or surgical scalpel. However, the invention will be described herein as the fluid ejection device 1 that is suitable for operation or treatment of living tissues. Hence, a fluid herein is a liquid such as water or physiological saline.

In FIG. 10, the fluid ejection device 1 includes a fluid supply container 2 that contains a fluid, a pump 14 as a fluid supplying unit, a pulsed flow generator 21 that converts the fluid supplied from the pump 14 into pulsed flow (hereinafter referred to also as pulse flow), a drive control unit 15 that controls driving of the pump 14 and the pulsed flow generator 21. The pump 14 and the pulsed flow generator 21 are connected by means of a fluid supply tube 4.

A connection channel tube 90 having a narrow pipe shape is connected to the pulsed flow generator 21. A nozzle 95 having a fluid ejection opening 96 with a reduced channel diameter is inserted in the connection channel tube 90 at the distal end. The connection channel tube 90 has a predetermined rigidity when ejecting a fluid.

The pulsed flow generator 21 includes an ejection command switching unit 25. In the embodiment, a pulse flow command switch 26 for selecting pulse flow ejection, a continuous flow command switch 27 for selecting continuous flow ejection, and an OFF switch 28 for stopping fluid ejection are provided as the ejection command switching unit 25.

The flow of fluid in the fluid ejection device 1 configured as described above will be briefly described. The fluid contained in the fluid supply container 2 is sucked by the pump 14 and supplied at a constant pressure to the pulsed flow generator 21 via the fluid supply tube 4. The pulsed flow generator 21 includes a fluid chamber 80 (refer to FIG. 11 described later), and a piezoelectric element 30 and a diaphragm 40 as a volume varying unit that varies the volume of the fluid chamber 80. The pulsed flow generator 21 drives the piezoelectric element 30 to generate pulsed flow in the fluid chamber 80, and ejects the fluid at a high speed in, for example, a pulsed manner from the fluid ejection opening 96 via the connection channel tube 90 and the nozzle 95.

When the pulsed flow generator 21 stops driving, the fluid supplied from the pump 14 passes through the fluid chamber 80 and is ejected as continuous flow from the fluid ejection opening 96.

The "pulsed flow" herein means the flow of fluid flowing in the constant direction and being associated with periodic or irregular variations in the flow rate or flow velocity of the fluid. The pulsed flow includes intermittent flow in which the flow and stop of the fluid are repeated, but does not necessarily have to be the intermittent flow because it is sufficient that the flow rate or flow velocity of the fluid varies periodically or irregularly.

In the same manner, "ejecting the fluid in a pulsed manner" means the ejection of fluid in which the flow rate or moving velocity of the fluid to be ejected varies periodically or irregularly. Examples of the ejection in a pulsed manner include intermittent ejection in which the ejection and non-ejection of the fluid are repeated. However, it does not have to be necessarily the intermittent ejection because it is sufficient that the flow rate or moving velocity of the fluid to be ejected varies periodically or irregularly.

Figure 11:
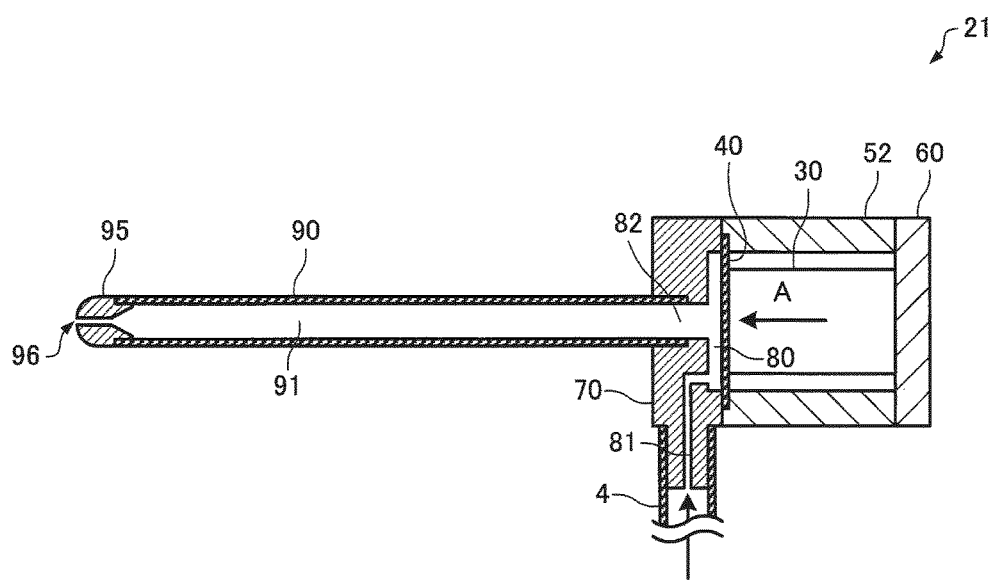
FIG. 11 is a cross-sectional view showing a cross section of a pulsed flow generator according to the embodiment taken along an ejection direction of fluid.

FIG. 11 is a cross-sectional view showing a cross section of the pulsed flow generator 21 according to the embodiment taken along the ejection direction of fluid. FIG. 11 is a schematic view in which vertical and lateral reduction scales of members or portions are different from actual ones for convenience sake. The pulsed flow generator 21 is configured to include an inlet channel 81 for supplying a fluid from the pump 14 to the fluid chamber 80 via the fluid supply tube 4, the piezoelectric element 30 and the diaphragm 40 as the volume varying unit that varies the volume of the fluid chamber 80, and an outlet channel 82 in communication with the fluid chamber 80. The fluid supply tube 4 is connected to the inlet channel 81.

The diaphragm 40 is formed of, for example, a disk-shaped metal thin plate. The diaphragm 40 is in tight contact between a case 52 and a case 70. The piezoelectric element 30 illustrated in the embodiment is a stacked piezoelectric element, and one of the both ends thereof is secured to the diaphragm 40 and the other end is secured to a bottom plate 60.

The fluid chamber 80 is a space formed by a recess formed in a surface of the case 70 facing the diaphragm 40 and the diaphragm 40. The outlet channel 82 is opened substantially at the center portion of the fluid chamber 80.

The case 70 and the case 52 are integrally joined at respective surfaces facing each other. The connection channel tube 90 having a connection channel 91 in communication with the outlet channel 82 is fitted to the case 70, and the nozzle 95 is inserted in the connection channel tube 90 at the distal end. The fluid ejection opening 96 having a reduced channel diameter is opened in the nozzle 95.

The piezoelectric element 30 corresponds to the capacitive load Z1 in FIG. 1. The deformation amount or deformation timing thereof is controlled by the drive signal 408 (refer to FIG. 10) from the capacitive load drive circuit 200. By pressing the fluid chamber 80 as indicated by the arrow A in FIG. 11, a fluid can be ejected in a pulsed manner from the nozzle 95 at the distal end. The fluid ejection device 1 is used as, for example, a device for medical purposes. Specifically, the fluid ejection device 1 can be used as a surgical device as follows: a liquid is supplied at a high pressure from the pump 14 to the fluid supply tube 4 introduced into a body cavity, and the liquid is ejected from the nozzle 95 at the distal end to excise tissues in the body cavity by a fluid pressure.

Moreover, the capacitive load drive circuit 200 can be applied as the fluid transport device 20 that transports a liquid at a stable flow rate.

Figure 12:
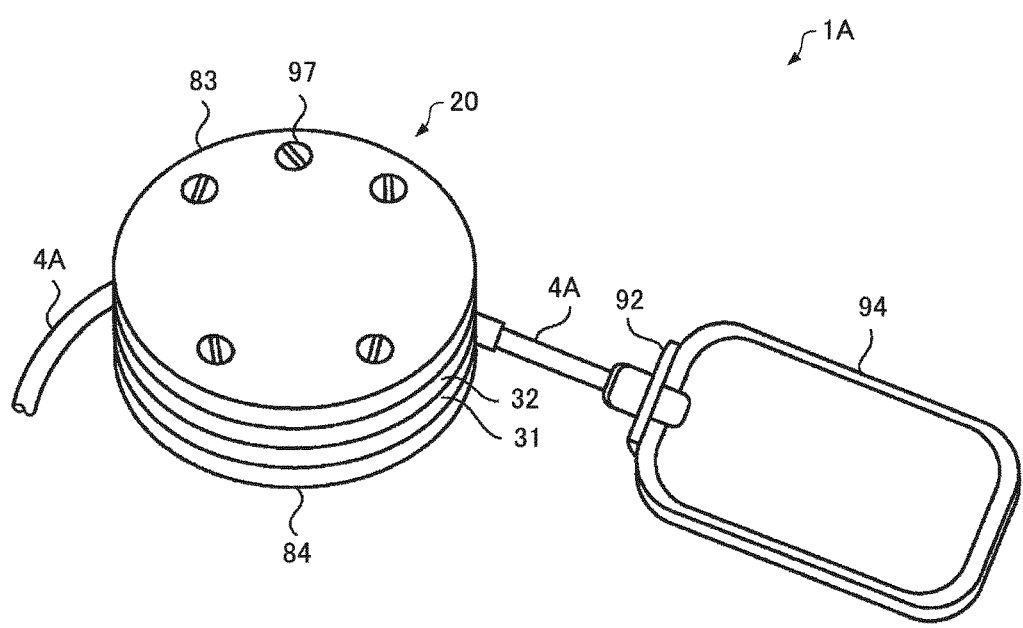
FIG. 12 is a perspective view sowing the appearance of a fluid transporter including a fluid transport device of the embodiment.

FIG. 12 is a perspective view showing the appearance of a fluid transporter 1A including the fluid transport device 20 of the embodiment. In FIG. 12, the fluid transporter 1A includes the fluid transport device 20 that transports a fluid by peristaltic action, and a pack-shaped fluid containing container 94 that contains the fluid. The fluid transport device 20 and the fluid containing container 94 are in communication with each other by means of a tube 4A.

The fluid containing container 94 is made of a synthetic resin having flexibility, and formed of, for example, a silicone-based resin. A tube holding portion 92 is provided at one end of the fluid containing container 94, and the tube 4A is hermetically fixed by means of pressure bonding, heat welding, adhesion, or the like so that the fluid does not leak.

The tube 4A is in communication at one end with the interior of the fluid containing container 94, passes through the fluid transport device 20, and is extended to the outside of the fluid transport device 20. The tube 4A transports the fluid contained in the fluid containing container 94 to the outside with the fluid transport device 20.

The fluid transport device 20 is formed by successively stacking a lower lid 84, a pump unit frame 31, a tube frame 32, and an upper lid 83 and integrating them using fixing screws 97 (upper lid fixing screws are shown in the drawing) or the like. In the interior of the fluid transport device 20, a push mechanism for transporting the fluid is stored.

When the fluid transporter 1A is mounted on a living body, a highly biocompatible material, for example, a synthetic resin such as polysulfone or urethane is preferably adopted for the lower lid 84, the pump unit frame 31, the tube frame 32, the upper lid 83, and the fluid containing container 94.

Figure 13:
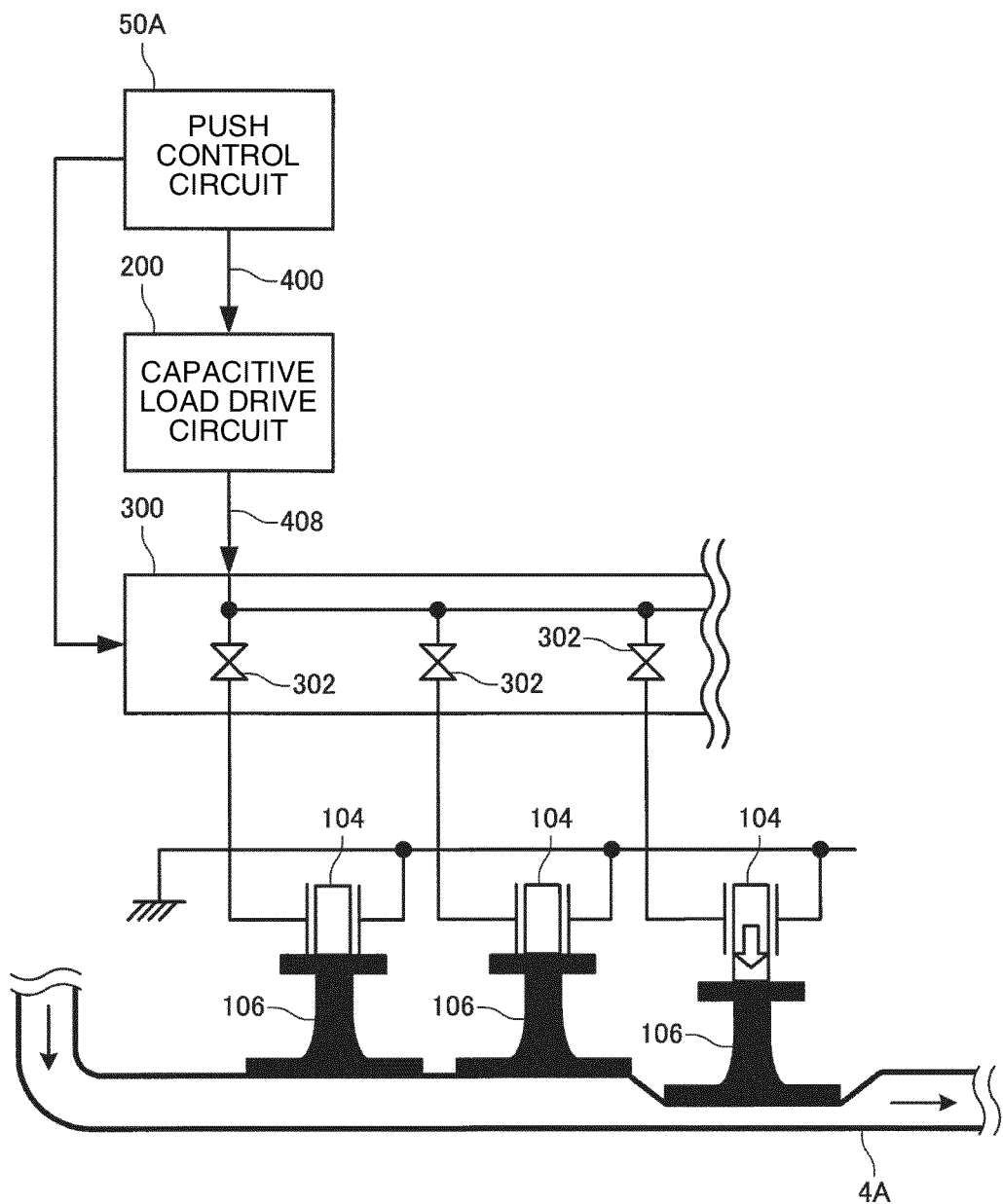
FIG. 13 explains the mechanism of fluid transportation of the fluid transport device.

FIG. 13 explains the mechanism of fluid transportation of the fluid transport device 20. The drive signal 408 as a voltage to be applied to the piezo element 104 is generated by the capacitive load drive circuit 200 based on the control signal 400 from a push control circuit 50A (not shown in FIG. 12). The generated drive signal 408 is supplied to the piezo element 104 via the gate unit 300. The gate unit 300 is a circuit unit having the plurality of gate elements 302 connected in parallel. The gate elements 302 can be individually brought into the conductive state or the cut-off state under the control from the push control circuit 50A. Hence, the drive signal 408 output from the capacitive load drive circuit 200 is caused, by the push control circuit 50A, to successively pass through the gate elements 302 to be applied to the corresponding piezo element 104, so that a corresponding pressing shaft 106 is pushed. The pressing shaft 106 is arranged in a direction substantially at right angle to a direction in which the fluid in the tube 4A flows. Then, the tube 4A is pressed successively by a plurality of pressing shafts 106. Therefore, the fluid transport device 20 can transport the fluid in the tube 4A by peristaltic action.

As fluids used in the invention, liquids having fluidity such as water, a salt solution, a medicinal solution, an oil, an aromatic solution, and ink, or gases can be used. For example, when a medicinal solution is used, the fluid transport device 20 can be used as a dosing pump.

According to the medical device of the embodiment described above, the switching circuit 230 in which the occurrence of ringing is suppressed is included, and therefore, it is possible to realize a medical device with which a fluid can be stably handled.

The embodiment and modified example described above are illustrative only, and the invention is not limited to them. For example, the embodiment and modified example can be appropriately combined.

The invention is not limited to the embodiment and modified example described above, and more various modifications are possible. For example, the invention includes configurations (for example, configurations having the same functions, methods, and results, or configurations having the same advantages and advantageous effects) that are substantially the same as those described in the embodiment. Moreover, the invention includes configurations in which a non-essential portion of the configurations described in the embodiment is replaced. Moreover, the invention includes configurations providing the same operational effects as those described in the embodiment, or configurations capable of achieving the same advantages. Moreover, the invention includes configurations in which a publicly known technique is added to the configurations described in the embodiment.

What is claimed is:

1. A liquid ejection device comprising a switching circuit, the switching circuit including:
    a multilayer wiring board including a first wiring layer and a second wiring layer;
    a first transistor and a second transistor mounted on the first wiring layer side of the multilayer wiring board; and
    a capacitor mounted on the second wiring layer side of the multilayer wiring board, wherein
    the multilayer wiring board includes
        a first wire, a second wire, and a third wire formed in the first wiring layer,
        a fourth wire, a fifth wire, and a sixth wire formed in the second wiring layer,
        a first via conductor electrically connecting the first wire with the fourth wire,
        a second via conductor electrically connecting the third wire with the fifth wire, and
        a third via conductor electrically connecting the second wire with the sixth wire,
    a drain electrode of the first transistor is electrically connected with the first wire,
    a source electrode of the first transistor is electrically connected with the second wire,
    a drain electrode of the second transistor is electrically connected with the second wire,
    a source electrode of the second transistor is electrically connected with the third wire,
    a first electrode of the capacitor is electrically connected with the fourth wire,
    a second electrode of the capacitor is electrically connected with the fifth wire, and
    when the multilayer wiring board is viewed in a plan view no via conductor electrically connects the second wire and the sixth wire in an area overlapping a straight-line path connecting the source electrode of the first transistor with the drain electrode of the second transistor in the second wire, wherein
    the multilayer wiring board further includes an eighth wire formed in the first wiring layer,
    a gate electrode of the second transistor is electrically connected with the eighth wire, and
    when the multilayer wiring board is viewed in the plan view, the fifth wire and the eighth wire are formed at positions where at least a portion of the fifth wire and at least a portion of the eighth wire overlap each other.

2. The liquid ejection device according to claim 1, wherein
    when the multilayer wiring board is viewed in the plan view, at least a portion of the fourth wire or the fifth wire is arranged so as to overlap the straight-line path connecting the source electrode of the first transistor with the drain electrode of the second transistor in the second wire.

3. The liquid ejection device according to claim 1, wherein
    when the multilayer wiring board is viewed in the plan view, the capacitor is arranged at a position closer to the second transistor than the first transistor.

4. The liquid ejection device according to claim 1, wherein
    the multilayer wiring board further includes a seventh wire formed in the first wiring layer,
    a gate electrode of the first transistor is electrically connected with the seventh wire, and
    when the multilayer wiring board is viewed in the plan view, the sixth wire and the seventh wire are formed at positions where at least a portion of the sixth wire and at least a portion of the seventh wire overlap each other.

5. A printing device comprising the liquid ejection device according to claim 1.

6. A printing device comprising the liquid ejection device according to claim 2.

7. A printing device comprising the liquid ejection device according to claim 3.

8. A printing device comprising the liquid ejection device according to claim 4.

* * * * *